United States Patent
Sobek et al.

(10) Patent No.: US 7,125,763 B1
(45) Date of Patent: Oct. 24, 2006

(54) SILICIDED BURIED BITLINE PROCESS FOR A NON-VOLATILE MEMORY CELL

(75) Inventors: Daniel Sobek, Portola Valley, CA (US); Timothy J. Thurgate, Sunnyvale, CA (US); Mark W. Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 09/885,426

(22) Filed: Jun. 19, 2001

Related U.S. Application Data

(60) Provisional application No. 60/236,654, filed on Sep. 29, 2000.

(51) Int. Cl.
   *H01L 21/8238* (2006.01)
(52) U.S. Cl. .................... 438/201; 438/211; 438/257
(58) Field of Classification Search ............... 257/314, 257/315, 316, 317, 318, 319, 320, 324, 325; 438/201, 211, 257, 261, 262, 263, 264, 266, 438/594
See application file for complete search history.

(56) References Cited

U.S. PATENT DOCUMENTS

| | | | | |
|---|---|---|---|---|
| 5,250,846 A | * | 10/1993 | Kondo | 257/756 |
| 5,739,569 A | * | 4/1998 | Chen | 257/321 |
| 5,859,454 A | * | 1/1999 | Choi et al. | 257/316 |
| 5,879,990 A | * | 3/1999 | Dormans et al. | 438/257 |
| 5,910,925 A | * | 6/1999 | Guterman et al. | 257/315 |
| 5,942,782 A | * | 8/1999 | Hsu | 257/355 |
| 6,051,858 A | * | 4/2000 | Uchida et al. | 257/295 |
| 6,174,758 B1 | * | 1/2001 | Nachumovsky | 438/199 |
| 6,211,548 B1 | * | 4/2001 | Ma | 257/321 |
| 6,218,695 B1 | * | 4/2001 | Nachumovsky | 257/296 |
| 6,346,442 B1 | * | 2/2002 | Aloni et al. | 438/261 |
| 6,477,084 B1 | * | 11/2002 | Eitan | 257/324 |
| 6,518,124 B1 | * | 2/2003 | Ebina et al. | 438/257 |
| 6,575,546 B1 | * | 6/2003 | Matsumoto et al. | 347/14 |
| 2002/0142546 A1 | * | 10/2002 | Kouznetsov et al. | 438/257 |

FOREIGN PATENT DOCUMENTS

| | | | | |
|---|---|---|---|---|
| JP | 57-177566 | * | 11/1982 | 29/80 |

* cited by examiner

Primary Examiner—Douglas W. Owens

(57) ABSTRACT

A process of fabricating a memory cell that includes a substrate that has a first region and a second region with a channel therebetween by forming a gate above the channel of the substrate, forming a bitline and siliciding the bitline.

14 Claims, 5 Drawing Sheets

SILICIDED BURIED BITLINE PROCESS FOR A NON-VOLATILE MEMORY CELL

Applicants claim, under 35 U.S.C. § 119(e), the benefit of priority of the filing date of Sep. 29, 2000, of U.S. Provisional Patent Application Ser. No. 60/236,654, filed on the aforementioned date, the entire contents of which are incorporated herein by reference.

BACKGROUND OF THE INVENTION

1. Field of the Invention

The present invention relates to the field of non-volatile memory devices. More particularly, the invention relates to a multi-bit flash electrically erasable programmable read only memory (EEPROM) cell with a bitline.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM.

An example of a single transistor Oxide-Nitrogen-Oxide (ONO) EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. Other examples of ONO EEPROM devices are disclosed in U.S. Pat. Nos. 5,635,415; 5,768,192 and PCT patent application publication WO 99/07000, the contents of each reference are hereby incorporated herein by reference.

In the case of known NROM devices, such as schematically shown in FIG. 1, an NROM cell 100 included a grid of polygates or word lines 102 and buried bitlines 104. The bitlines 104 were formed in the N+ region of the substrate so that a higher density of bitlines can be formed that region versus when the bitlines were formed in a metal layer. Select transistors 106 were required to be placed every N or N/2 polygates 102, where N is the number of polygates between contacts 108. This in the past has required a select transistor 106 being required every 16 or 32 cells in order to reduce the bitline to cell resistance. The bitline resistance in the N+region limits the number of cells between select transistors.

In the case of flash memory cells with a stacked gate, contacts associated with the cell must be spaced from the polysilicon of the gate. As feature sizes are reduced according to integrated circuit processes, smaller dimensions are required to achieve higher packing densities. Generally, contacts must be spaced apart from the stacked gate so alignment errors do not result in a shorting of the stacked gate with the source contact or the drain contact. The spacing between the contact and gate contributes to the overall size of the flash memory cell.

SUMMARY OF THE INVENTION

One aspect of the invention regards a memory cell that includes a substrate that has a first region and a second region with a channel therebetween and a gate above the channel. A charge trapping region that contains a first amount of charge and a layer positioned between the channel and the charge trapping region, wherein the layer has a thickness such that the first amount of charge is prevented from directly tunneling into the layer and a silicided bitline.

A second aspect of the present invention regards a process of fabricating a memory cell including a substrate that has a first region and a second region with a channel therebetween. The process includes forming a gate above the channel of the substrate, forming a bitline and siliciding the bitline.

One or more of the above aspects of the present invention provides the advantage of decreasing the total cell resistance and increasing the number of cells between select transistors.

One or more of the above aspects of the present invention provides the advantage of requiring no contacts with the core array and thus reducing the size of a unit cell and the total size of an array.

One or more of the above aspects of the present invention provides the advantage of reducing bitline resistance and resulting in longer distances between contacts.

One or more of the above aspects of the present invention provides the advantage of enhancing bitline resistance variability by having a resistance that is less dependent on buried oxide thickness uniformity.

One or more of the above aspects of the present invention provides the advantage of reducing the gate stack height when compared to conventional floating gate processes that results in better gate CD control.

One or more of the above aspects of the present invention provides the advantage of reducing stress-induced device edge defects due to the absence of isolation between the wordlines.

One or more of the above aspects of the present invention provides the advantage of being versatile since it allows for both n and p-type doping in periphery devices.

The present invention, together with attendant objects and advantages, will be best understood with reference to the detailed description below in connection with the attached drawings.

DETAILED DESCRIPTION OF THE INVENTION

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

Two bit memory cells are typically accessed by buried bitlines formed in a semiconductor substrate. A bitline oxide layer is formed over the buried bitline prior to forming a central gate electrode.

Figure 1:
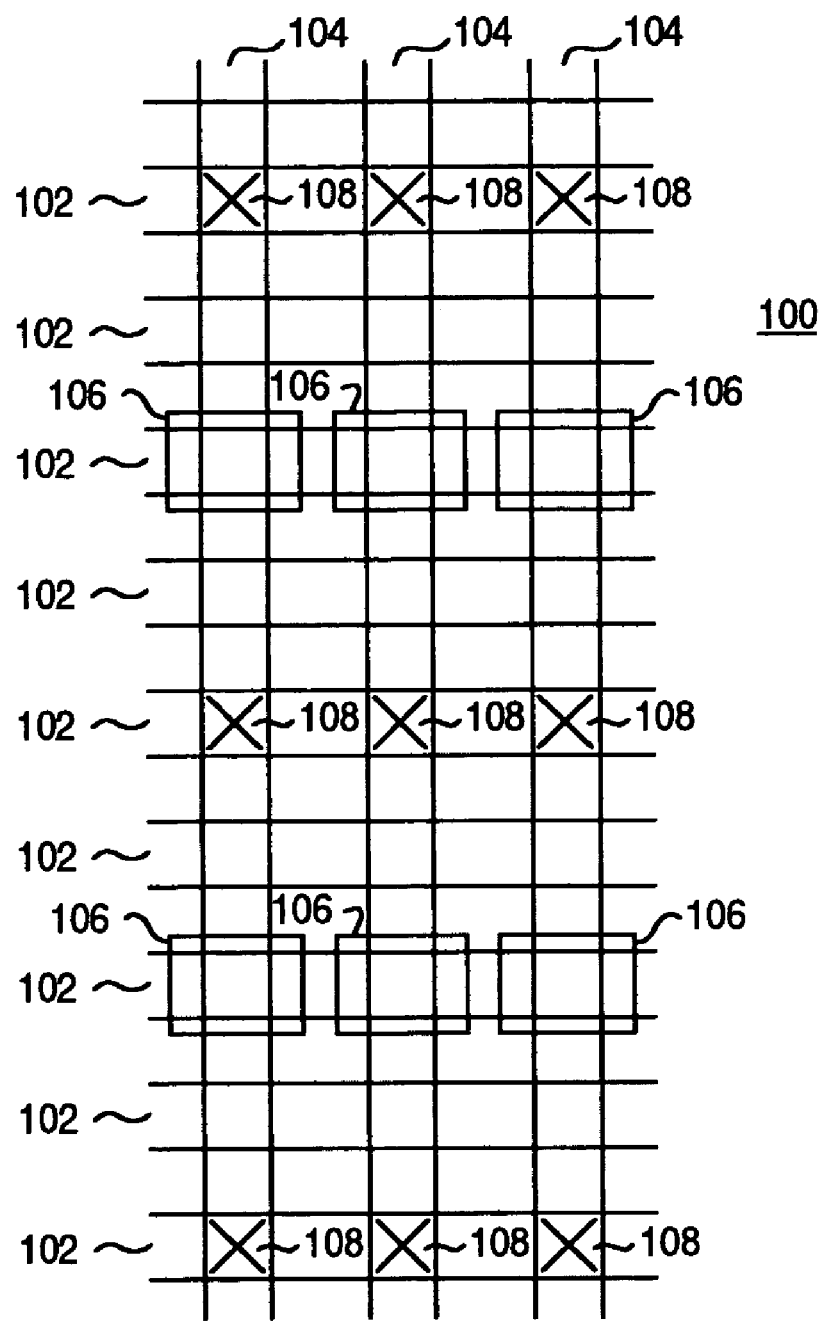
FIG. 1 illustrates a top cross-sectional view of a prior art NROM cell with a buried bit line.
Figure 2:
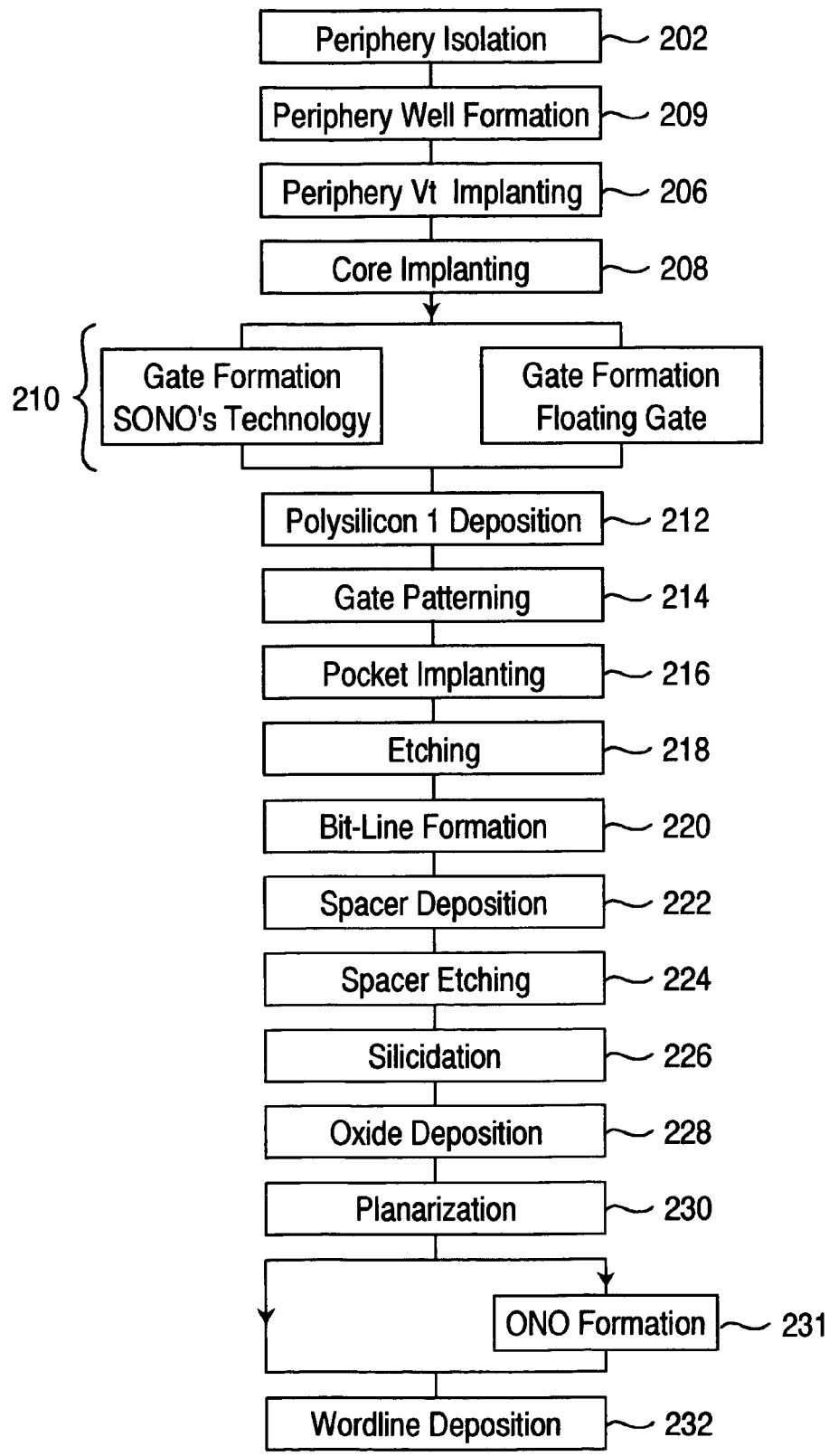
FIG. 2 is a flow chart illustrating a process of fabricating a memory cell according to an embodiment of the present invention.

A flow chart is shown in FIG. 2 that summarizes a number of steps of a fabrication process according to the present invention to produce a memory according to the present invention. Steps 202, 204, 206 and 208 regard the well known steps of preparing the semiconductor substrate 300 by first performing periphery isolation in step 202 via such well known techniques as local oxidation of silicon (LOCOS) or shallow trench isolation. Next, periphery well formation and Vt implants are performed in a well known manner per steps 204 and 206, respectively. Core implanting is then performed per step 208.

Figure 3:
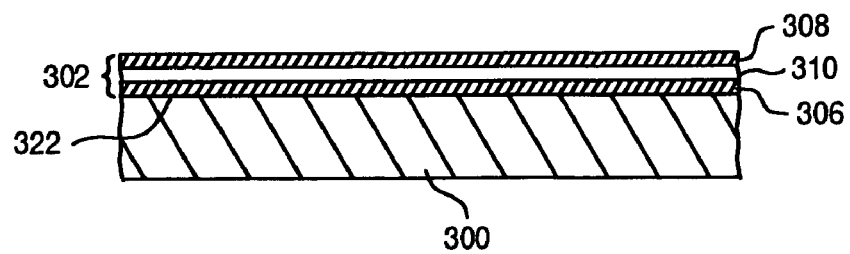
FIGS. 3–10 illustrate side cross-sectional views of processing steps to form an embodiment of the present invention.

After the semiconductor substrate 300 has been prepared per steps 202, 204, 206 and 208, the gate electrodes 329 are formed per step 210 by placing an ONO layer 302 overlying the semiconductor substrate 300 as shown in FIG. 3. The ONO layer 302 includes a first oxide layer 306, a second oxide layer 308 and a silicon nitride layer 310 sandwiched between the first oxide layer 306 and the second oxide layer 308.

Figure 4:
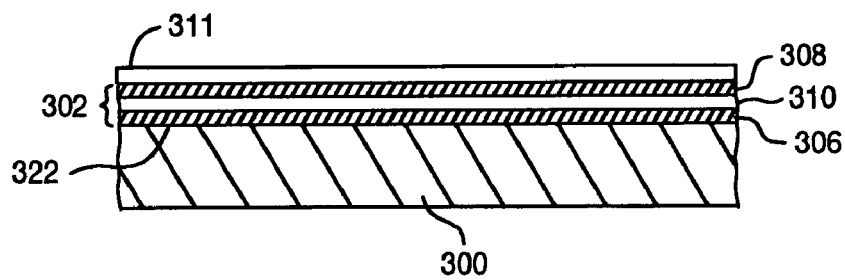

After the layers 306, 308, 310 are formed per step 210, a polysilicon 1 layer 311 is deposited on the second oxide layer 308 in a well known manner as shown in FIG. 4 per step 212.

Figure 5:
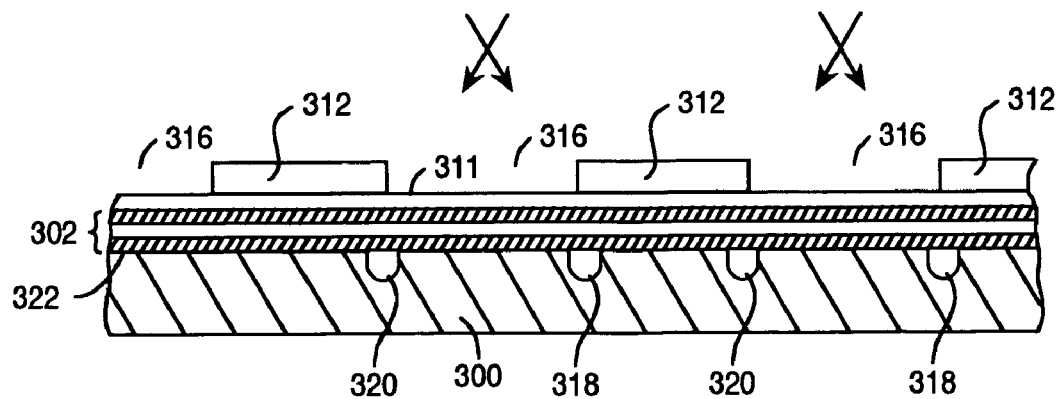

After the polysilicon 1 layer 311 is formed on layer 308, the gate electrodes 329 are patterned per step 214 by placing a resist layer 312 so as to overly the ONO layer 302 as shown in FIG. 5. Resist layer 312 can be one of a number of different types of resist, including optical photoresist responsive to visible and near UV light, deep UV resist and the like. Alternatively, resist layer 312 can be an inorganic resist layer, an X-ray resist layer and the like. In a preferred embodiment, resist layer 312 is a Novolak resin photoresist material.

Resist layer 312 is exposed to radiation of the appropriate wavelength and developed to form a resist pattern overlying ONO layer 302 and layer 311, as illustrated in FIG. 5. Resist pattern 312 is formed to have a predetermined geometric configuration for the fabrication of buried bitline regions in semiconductor substrate 300. Resist pattern 312 allows for exposing selected regions 316 of semiconductor substrate 300.

Once resist pattern 312 is formed, an implantation process is carried out per step 216 to form pocket regions 318, 320 in semiconductor substrate 300. Pocket regions 318, 320 are preferably formed by an angled ion implant process in which semiconductor substrate 300 is held at an angle of about 7° to about 60°, typically 30° to 45°, with respect to normal during the ion implantation process. The angled ion implant process forms pocket regions 318, 320 in semiconductor substrate 300 in locations that partially underlie a portion of resist pattern 312. In a preferred embodiment, a p-type dopant, such as boron or $BF_2$, is ion implanted into semiconductor substrate 300 to form pocket regions 318, 320. During the ion implantation process, the boron ions penetrate ONO layer 302 and enter semiconductor substrate 300 at an angle sufficient to create a boron pocket region that extends partially beneath resist pattern 312.

Figure 6:
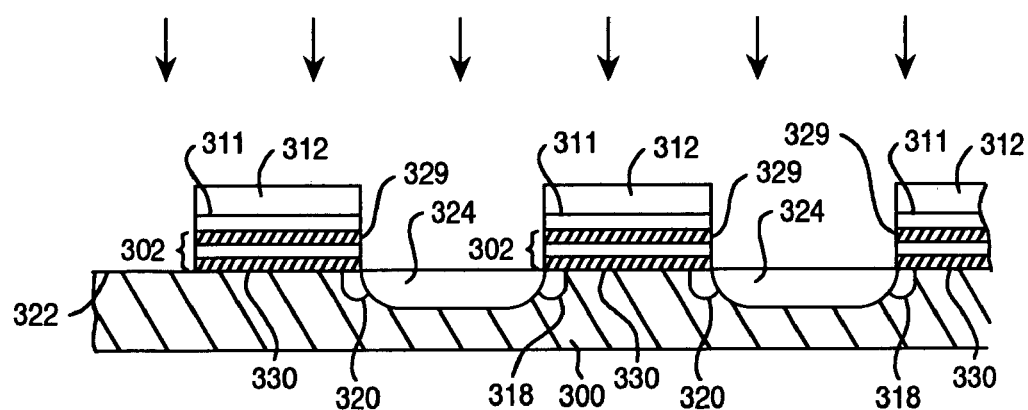

Referring to FIG. 6, after forming the pocket regions 318, 320, portions of ONO layer 302 exposed by resist pattern 312 are etched per step 218 to expose principal surface 322 of semiconductor substrate 300. Preferably, resist pattern 312 is used as an etching mask, such that the etching process exposes principal surface 312 in selected regions 316 defined by resist mask 312. In a preferred embodiment, ONO layer 302 and layer 311 are anisotropically etched, such that ONO layer 302, layer 311 and resist pattern 312 have continuous, substantially vertical sidewalls.

Once the etching process is complete, preferably an ion implantation process is carried out per step 220 to form a buried bitline region 324 in selected region 316 of semiconductor substrate 300. Preferably, an n-type dopant, such as arsenic, is ion implanted at an angle of incidence substantially normal to principal surface 322 of semiconductor substrate 300. Preferably, buried bitline region 324 is formed by the ion implantation of arsenic using a dose of about $3 \times 10^{15}$ to about $5 \times 10^{15}$ ions per square centimeter. The ion implantation energy is selected so as to form buried bitline region 324 to a selected junction depth in semiconductor substrate 300. Preferably, the ion implantation energy is of sufficient magnitude, such that the junction depth of buried bitline region 324 is greater than the junction depth of pocket regions 318, 320. As used herein, the term "junction depth" refers to the distance from the surface of the substrate to the deepest point of formation of a p/n junction associated with the implanted region within the substrate.

Figure 7:
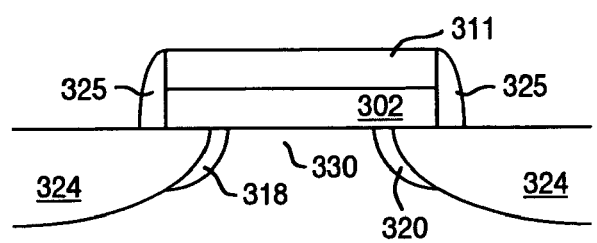
Figure 8:
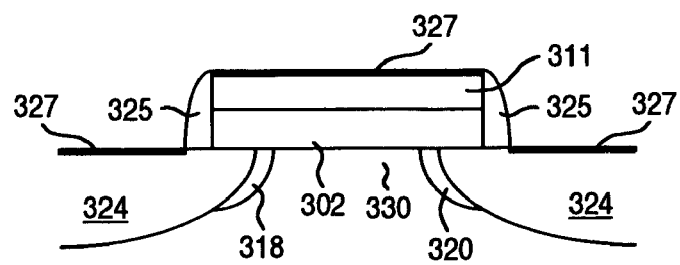

After the bitline regions 324 are formed, spacers 325 are deposited per step 222 between the gate electrodes 329 in a well known manner. The spacers 325 are made of a well known material. After being deposited, the spacers 325 are etched in a well known manner per step 224 to form the spacers 325 at either side of the gate electrode as schematically shown in FIG. 7. After being etched, each spacer 325 has a thickness ranging from HTO 400 to 800 Angstroms.

After the spacers 325 are etched per step 222, the gate 329 and the bitline regions 324 are subjected to a silicidation process per step 226 by placing a layer 327 of silicide (titanium or cobalt) thereon. The silicided bitline has a reduced resistance when compared with a bitline that is not silicided. Thus, a silicided bitline reduces the IR drop per bitline unit length.

Next, a conformal TEOS, BPSG or other oxide deposition 331 is made on the bitline regions 324 and the gate electrodes 329 per step 228. The deposition 331 is polished or planarized per step 230 to the level of the silicide layer 331 present on gate electrodes 329 so that the oxide deposition 331 is removed from the gate electrodes 329 as shown in FIG. 9.

Those skilled in the art will recognize that other methods for forming the memory cell arrays are possible. For example, the order of formation of the pocket regions 318, 320 and the buried bitline region 324 can be reversed from that described above. In an alternative embodiment, before etching ONO layer 302, an implant process can be carried out to form bitline region 324, followed by an angled implant process to form pocket regions 318, 320. In yet another alternative, ONO layer 302 can be etched before either implant process is carried out.

Figure 9:
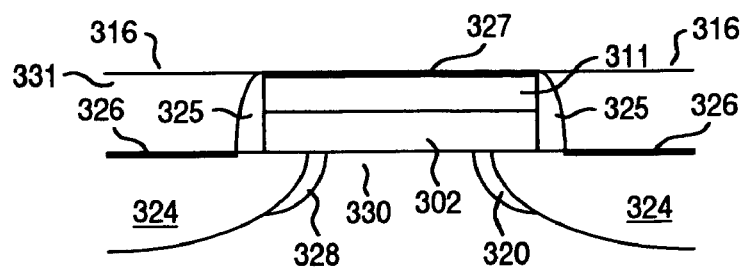

As illustrated in FIG. 9, the resist pattern 312 is removed and bitline oxide regions 324 are formed. The bitline oxide layer 326 is formed by thermal oxidation of semiconductor substrate 300 using ONO layer 302 as an oxidation mask. ONO layer 302, having been previously patterned by the etching process described above, exposes selected regions 316 of semiconductor substrate 300. During the oxidation process, the patterned portions of ONO layer 302 prevent the oxidation of semiconductor substrate 300 in region underlying ONO layer 302. Accordingly, bitline oxide layers 326 are confined to selected regions 316 of semiconductor substrate 300. Upon completion of the oxidation process, bitline layers 326 overly buried bitline regions 324 in semiconductor substrate 300.

Figure 10:
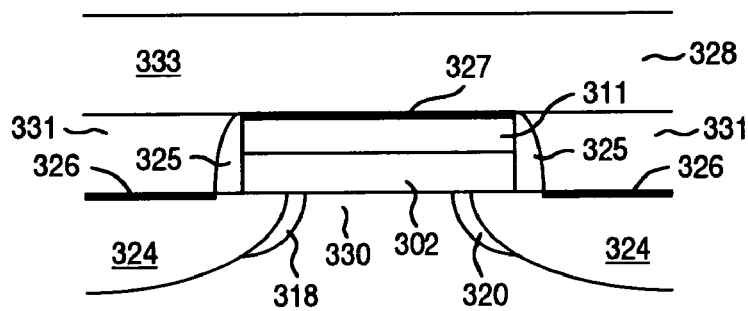
Figure 11:
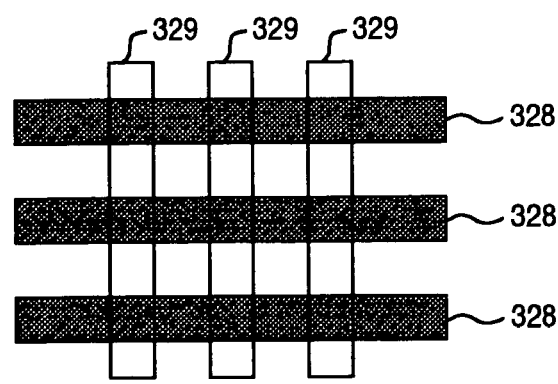
FIG. 11 illustrates a top view of a memory cell array in accordance with an embodiment of the present invention utilizing the process of FIGS. 2–10.

In addition to the layers 326, wordlines 328 are formed, per step 232, over the floating gate electrodes 329 by depositing a layer 333 of polysilicide or Metal 1 on the gate electrodes 329 and the planarized oxide deposition 331 followed by patterning and etching to form the wordlines 328 shown in FIGS. 10 and 11. Note that since the wordlines 328 are routed directly over the bitlines 324, no local oxidation of silicon (LOCOS) or trench isolation between wordlines is needed. In addition, having the layer 333 cover the gate electrode 329 aids in maintaining the integrity of the gate 329.

Once the above-described process is complete, a two bit flash EEPROM cell is formed as shown in FIGS. 10 and 11. The flash EEPROM memory cell includes an N+ type substrate 300 having two buried PN junctions, one being between the source pocket 318 and substrate 300, termed the left junction and the other being between the drain pocket 320 and the substrate 300, termed the right junction. Above the channel 330 is an oxide layer 306 made of silicon dioxide. The oxide layer 306 has a thickness that ranges from about 60 Angstroms to about 150 Angstroms, and which forms an electrical isolation layer over the channel.

On top of the oxide layer 306 is a charge trapping layer 310 that has a thickness ranging from approximately 50 to 150 Angstroms and preferably is comprised of silicon nitride, $Si_3N_4$. The hot electrons are trapped as they are injected into the charge trapping layer so that the charge trapping layer serves as the memory retention layer.

The thickness of layer 310 is chosen to be in a range of approximately 20 Angstroms to about 120 Angstroms, to prevent electrons from tunneling through the layer 306 and leaving charge trapping layer 310 during the operation of the cell. Thus, the lifetime of the cell of this invention is greatly extended relative to prior art NMOS devices. The memory cell is capable of storing two bits of data, a right bit and a left bit.

It is important to note that the two-bit memory cell is a symmetrical device. For example, the left junction serves as the source terminal and the right junction serves as the drain terminal for the right bit. Similarly, for the left bit, the right junction serves as the source terminal and the left junction serves as the drain terminal. Thus, the terms left, or first junction and right or second junction are used herein rather than source and drain. When the distinction between left and right bits is not crucial to the particular discussion, the terms source and drain are utilized. However, it should be understood that the source and drain terminals for the second bit are reversed compared to the source and drain terminals for the first bit.

A layer of silicon dioxide 308 is formed over the charge trapping layer, (i.e., silicon nitride layer), and has a thickness that ranges between approximately 20 to 120 Angstroms. The silicon dioxide layer 308 functions to electrically isolate a conductive gate 328 formed over the silicon dioxide layer 308 from charge trapping layer 310. The thickness of gate 329 is approximately 4,000 Angstroms. Gate 329 is constructed from an N-type material, such as polycrystalline silicon that is typically heavily doped with an N-type impurity such as phosphorous in the $10^{19}$ to $10^{20}$ atom/cc range.

It is important to note that when a semiconductor device is scaled, the channel lengths become shorter and short channel effects take hold. Thus, in the two bit memory cell, because each bit is stored in different areas of the transistor, short channel effects may become prevalent sooner than in the case of the single bit transistor. In order to retain the usable range of drain voltage, the two-bit transistor may need to be scaled by a smaller factor. For example, the length of a bitline can be scaled by reducing the thermal cycle of the bitline. This type of scaling overcomes the limitations on scaling brought on by diffusion.

While the afore-mentioned process regards an Oxide-Nitride-Oxide (ONO) gate dielectric flash EEPROM device, also known as SONOS, it can also be applied for the fabrication of floating gate EEPROM devices. Examples of floating gate EEPROM devices are disclosed in the technical articles entitled "High Density Contactless, Self Aligned EPROM Cell Array Technology," J. Esquivel et al., IEDM 86, 1986, pp. 592–595 and "A Novel Dual String NOR (DuSNOR) Memory Cell Technology Scalable to the 256 Mbit and 1 Gbit Flash Memories," K. S. Kim et al., IEDM 95, 1995, pp. 263–266. The flow chart of FIG. 2 illustrates the similarities and the differences between the two fabrication processes. For example, steps 202, 204, 206, 208, 212, 214, 216, 218, 220, 222, 224, 226, 228, 230 and 232 are essentially the same for both processes. One difference is that for the formation of a SONOS device, step 210 requires placing an ONO layer 302 overlying the semiconductor substrate 300. In contrast, the floating gate EEPROM device is fabricated by placing a tunnel oxide layer overlying the semiconductor substrate instead of ONO layer 302. Such a tunnel oxide layer would have a thickness ranging from approximately 80 Angstroms to approximately 150 Angstroms.

Another difference in the fabrication of SONOS EEPROM devices and floating gate EEPROM devices is that the floating gate EEPROM devices include an additional step 231 as shown in FIG. 2. Step 231 entails forming an ONO layer on the silicide layer 327 deposited on the gate electrode 329 where the ONO layer has a structure similar to layers 306, 308 and 310 described previously with respect to the EEPROM SONOS devices.

The foregoing description is provided to illustrate the invention, and is not to be construed as a limitation. Numerous additions, substitutions and other changes can be made to the invention without departing from its scope as set forth in the appended claims. For example, the above-described process can be applied to formation of periphery devices.

We claim:

1. A process of fabricating a memory cell comprising a substrate that comprises a first region and a second region with a channel therebetween, the method comprising:

forming a gate above said channel of said substrate, wherein said gate comprises a single polysilicon layer;

forming bitlines on both sides of said gate subsequent to said forming said gate comprising said single polysilicon layer;

siliciding said bitlines;

forming a charge trapping region that contains a first amount of charge; and forming a layer between said channel and said charge trapping region, wherein said layer has a thickness such that said first amount of charge is prevented from directly tunneling into said layer.

2. The process of claim 1, comprising forming an oxide over said bitlines.

3. The process of claim 1, comprising siliciding said single polysilicon layer.

4. The process of claim 3, wherein said siliciding of said bitlines and said single polysilicon layer occur simultaneously.

5. The process of claim 1, wherein said charge trapping region comprises silicon nitride.

6. The process of claim 1, wherein said gate comprises an N-type material.

7. The process of claim 6, wherein said gate comprises a polycrystalline silicon.

8. The process of claim 1, further comprising forming an insulating layer on said charge trapping region.

9. The process of claim 8, wherein said insulating layer comprises silicon dioxide.

10. The process of claim 9, wherein said charge trapping region comprises silicon dioxide.

11. The process of claim 1, wherein said memory cell comprises an EEPROM memory cell.

12. The process of claim 1, wherein said memory cell comprises a two-bit memory cell.

13. The process of claim 1, wherein said substrate comprises a P-type substrate.

14. The process of claim 1, further comprising scaling the length of said bitlines.

* * * * *